(«12») United States Patent
Yamaguchi et al.

(10) Patent No.: US 11,177,112 B2
(45) Date of Patent: Nov. 16, 2021

(54) PATTERN MEASUREMENT DEVICE AND NON-TRANSITORY COMPUTER READABLE MEDIUM HAVING STORED THEREIN PROGRAM FOR EXECUTING MEASUREMENT

(71) Applicant: Hitachi High-Tech Corporation, Tokyo (JP)

(72) Inventors: Satoru Yamaguchi, Tokyo (JP); Kei Sakai, Tokyo (JP); Makoto Suzuki, Tokyo (JP); Ryota Watanabe, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/959,616

(22) PCT Filed: Mar. 19, 2018

(86) PCT No.: PCT/JP2018/010694
§ 371 (c)(1),
(2) Date: Jul. 1, 2020

(87) PCT Pub. No.: WO2019/180760
PCT Pub. Date: Sep. 26, 2019

(65) Prior Publication Data
US 2020/0411281 A1    Dec. 31, 2020

(51) Int. Cl.
*H01J 37/28*        (2006.01)
*H01J 37/147*       (2006.01)

(52) U.S. Cl.
CPC .......... *H01J 37/28* (2013.01); *H01J 37/1478* (2013.01); *H01J 2237/24571* (2013.01); *H01J 2237/2817* (2013.01)

(58) Field of Classification Search
CPC .. H01J 37/00; H01J 37/02; H01J 37/26; H01J 37/28; H01J 37/1478; H01J 37/22;
(Continued)

(56) References Cited

U.S. PATENT DOCUMENTS 5,161,201 A    11/1992  Kaga et al.
8,952,329 B1*  2/2015   Shih ........................ G03F 7/705
                                                          250/307
(Continued)

FOREIGN PATENT DOCUMENTS

JP    3-233309 A       10/1991
JP    2003-517199 A    5/2003
(Continued)

OTHER PUBLICATIONS

International Search Report (PCT/ISA/210) issued in PCT Application No. PCT/JP2018/010694 dated Jun. 12, 2018 with English translation (four pages).
(Continued)

*Primary Examiner* — Jason L McCormack
(74) *Attorney, Agent, or Firm* — Crowell & Moring LLP

(57) ABSTRACT

The present invention proposes a pattern measurement tool characterized by being provided with: a charged-particle beam sub-system having a tilt deflector; and a computer sub-system which is connected to the charged-particle beam sub-system and which is for executing measurement of a pattern on the basis of a signal obtained by said charged-particle beam sub-system, wherein the charged-particle beam sub-system acquires at least two signal profiles by scanning beams having at least two incidence angles, the computer sub-system measures the dimension between one end and the other end of the pattern on the basis of the at least two signal profiles, calculates the difference between the two measurements, and calculates the height of the
(Continued)

pattern by inputting the difference value determined by said calculation into a relational formula indicating the relation between the height of the pattern and said difference value.

8 Claims, 8 Drawing Sheets

(58) Field of Classification Search
CPC .................. H01J 37/222; H01J 37/244; H01J 2237/24571; H01J 2237/2817; H01J 2237/22; H01J 2237/2814; G01B 15/02
USPC .......................................... 250/306, 307, 311
See application file for complete search history.

(56) References Cited

U.S. PATENT DOCUMENTS

| | | |
|---|---|---|
| 2004/0188611 A1 | 9/2004 | Takeuchi et al. |
| 2005/0116164 A1* | 6/2005 | Goldenshtein ...... H01J 37/1478 250/311 |
| 2007/0187595 A1* | 8/2007 | Tanaka ............... G01N 23/2251 250/307 |
| 2012/0217392 A1* | 8/2012 | Murakawa ........... G01N 23/225 250/307 |
| 2019/0035600 A1* | 1/2019 | Sakai ...................... H01J 37/28 |

FOREIGN PATENT DOCUMENTS

| | | |
|---|---|---|
| JP | 2004-214060 A | 7/2004 |
| JP | 2007-218711 A | 8/2007 |
| WO | WO 01/45136 A1 | 6/2001 |

OTHER PUBLICATIONS

Japanese-language Written Opinion (PCT/ISA/237) issued in PCT Application No. PCT/JP2018/010694 dated Jun. 12, 2018 (four pages).

* cited by examiner

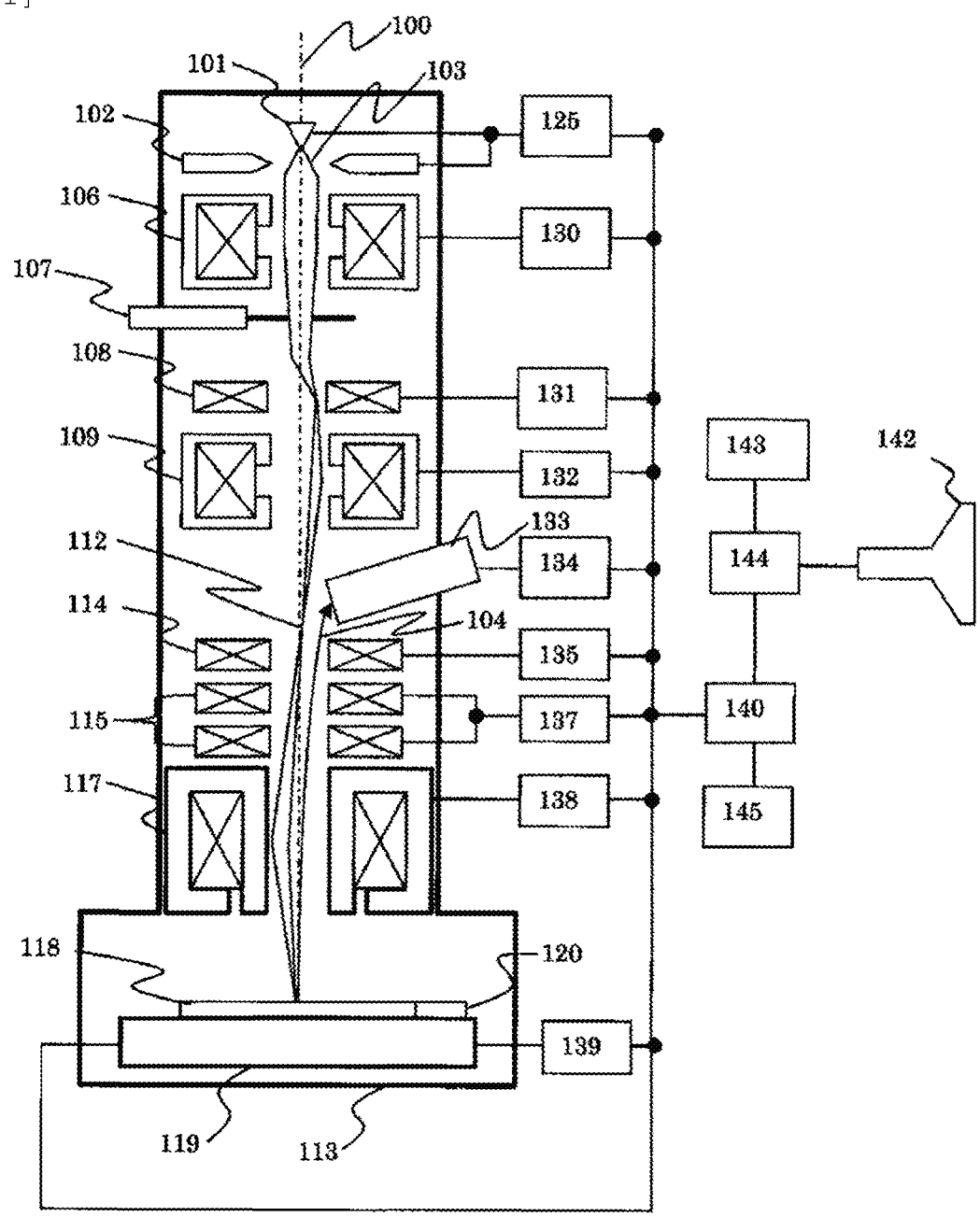
[FIG. 1]

FIG. 2A
WHEN BEAM TILT ANGLE IS 0 DEGREE
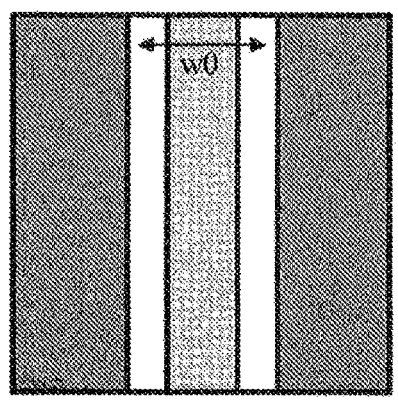
x0  x1   x2   x3
θ: SIDE WALL TILT ANGLE
φn: BEAM TILT ANGLE
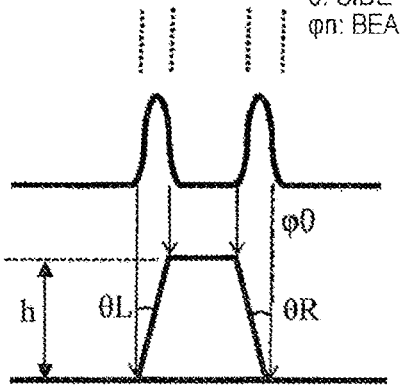
FIG. 2B
WHEN BEAM TILT ANGLE IS EQUAL TO
OR LESS THAN SIDE WALL ANGLE
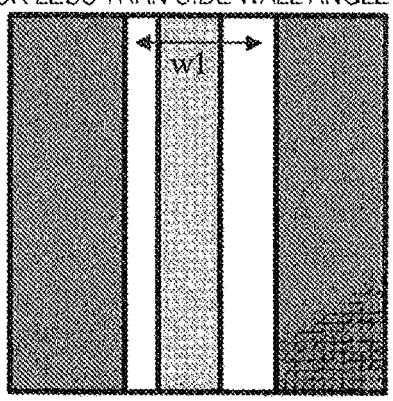
x0' x1'   x2' x3'
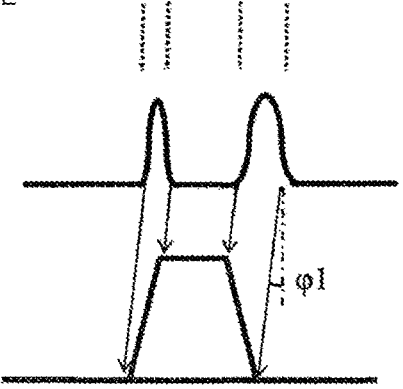

[FIG. 4]

Height Measurement — 400

Input — 401
- Expected Height: 100 nm  [SET] — 402

SEM condition
- 411 — Magnification: 270 k
- 412 — Scan Size: 512 × 512
- 413 — Number of Frame: 16

Tilt Parameters
- 421 — Step of Tilt Angle: 2 deg.
- 422 — Min./Max. Tilt Angle: −10 ~ 10 deg.
- 423 — Number of Iteration: 5

Measurement Parameters
- 431 — Kind: Line
- 432 — Method: Threshold
- 433 — Size of Smoothing Filter: 5
- 434 — Box Size: X: 200  Y: 400

Results — 440
- 441 — Height: 105.4 nm
- 442 — Taper Angle: Left 2.3  Right 2.7 deg.
- 443 — Ratio of edge pos. for height: 50 %

[Execute] — 450

[FIG. 5]
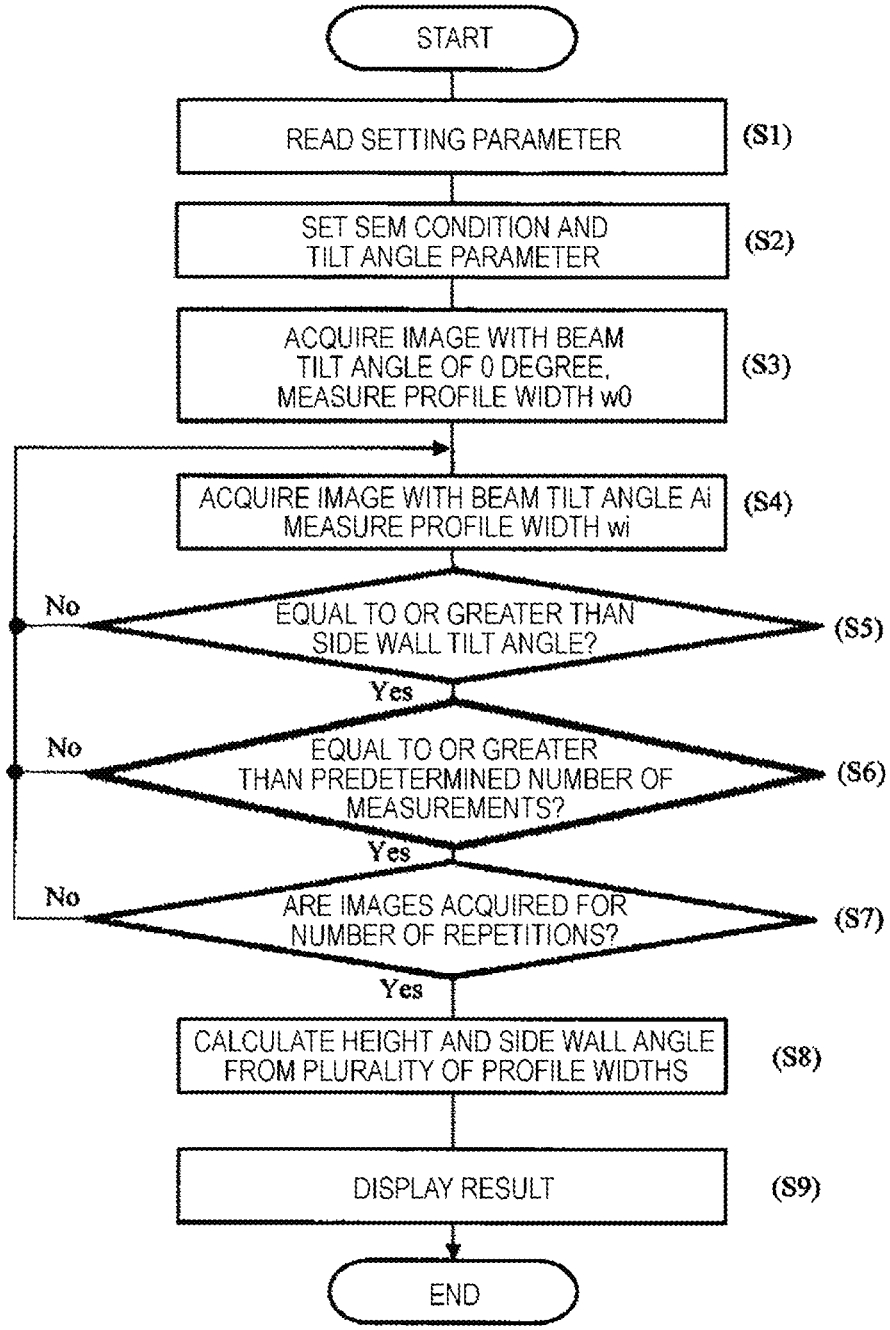

[FIG. 6]
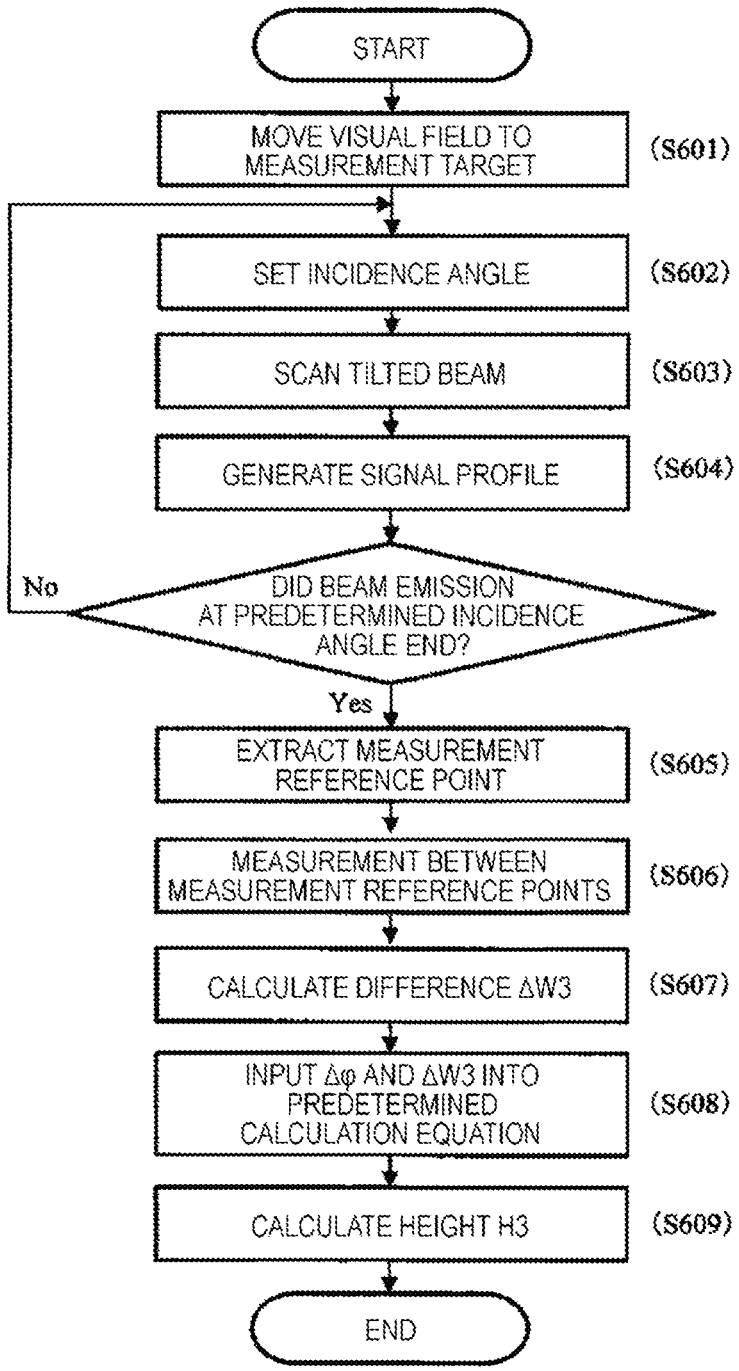

[FIG. 7]
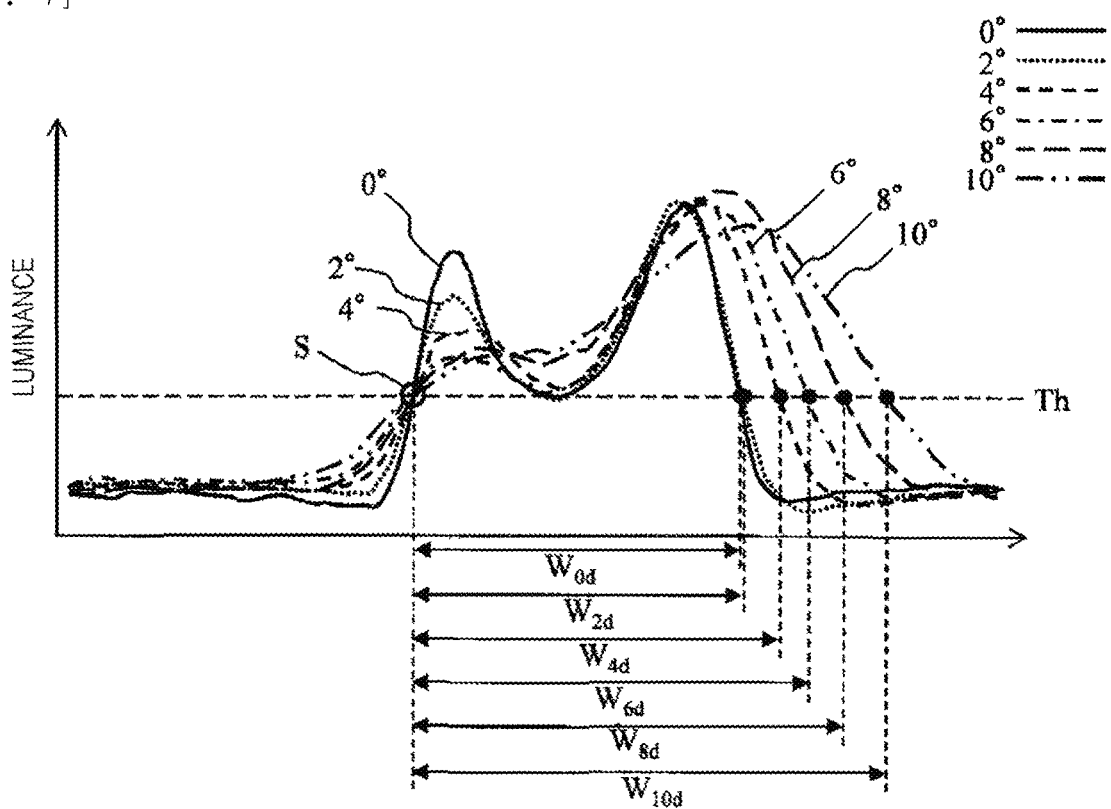

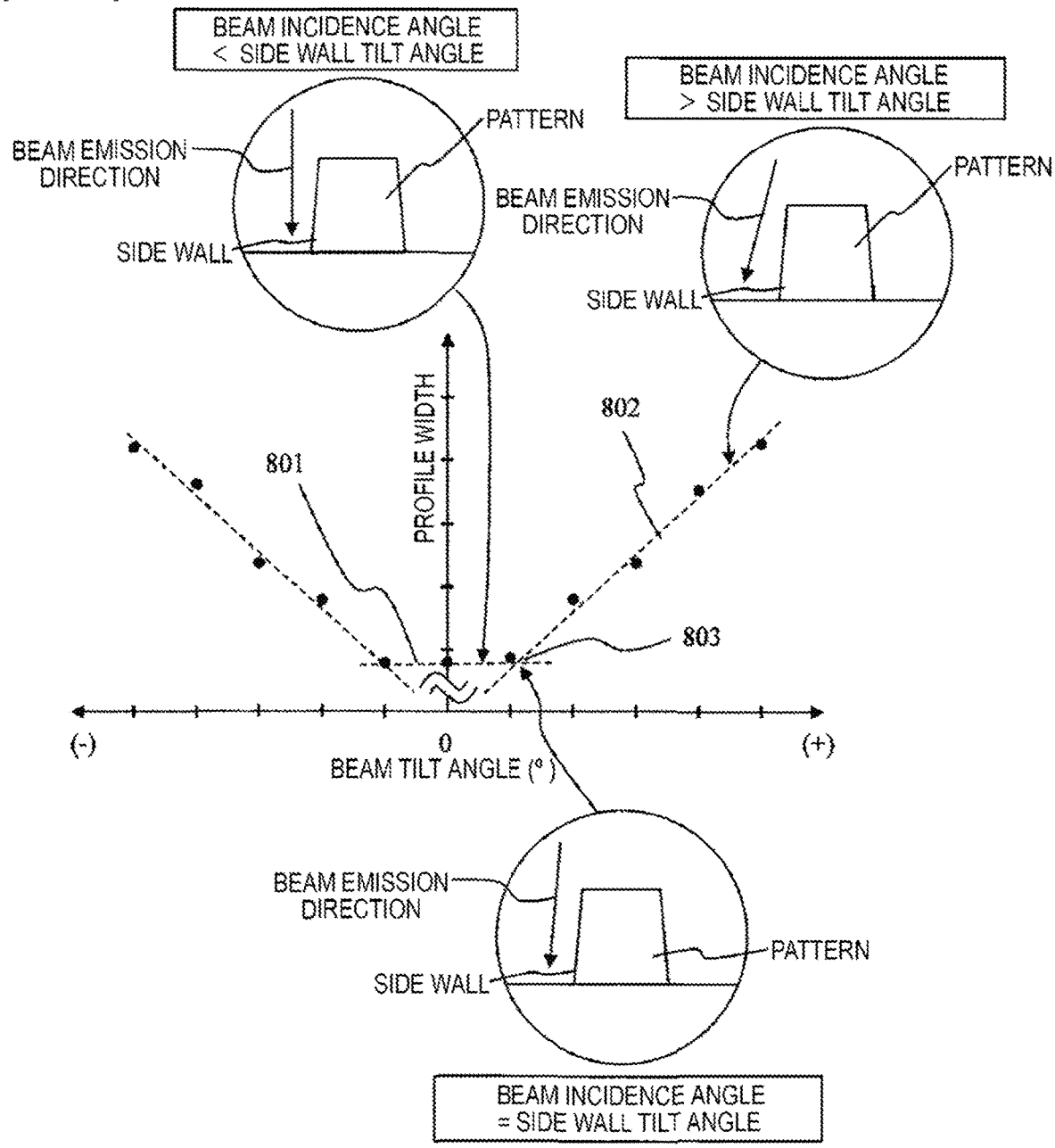
[FIG. 8]

PATTERN MEASUREMENT DEVICE AND NON-TRANSITORY COMPUTER READABLE MEDIUM HAVING STORED THEREIN PROGRAM FOR EXECUTING MEASUREMENT

TECHNICAL FIELD

The present disclosure relates to a method for measuring a height of a pattern and a charged-particle beam device, and more particularly to a method and a device for measuring a height of a pattern formed on a semiconductor wafer obtained in a semiconductor manufacturing process.

BACKGROUND ART

In Japanese Translation of PCT International Application Publication No. 2003-517199 (PTL 1), disclosed is a method for geometrically obtaining a height of an object from an image obtained by performing scanning with two tilt beams having different tilt angles.

CITATION LIST

Patent Literature

PTL 1: Japanese Translation of PCT International Application Publication No. 2003-517199 (International Publication Number W001/45136A1)

SUMMARY OF INVENTION

Technical Problem

According to a method disclosed in Japanese Translation of PCT International Application Publication No. 2003-517199 (PTL 1), while a height of a pattern can be obtained by substituting a difference between an edge of a top part of a pattern and an edge of a bottom part thereof into a predetermined arithmetic formula, a signal profile and an SEM image obtained by performing a beam tilt vary depending on a difference in a material of a sample and a cross-sectional shape thereof, or a condition of a beam to be emitted. For example, when the beam condition such as an arrival energy is changed, a diffusion range of a secondary electron in the sample is changed, and a distribution of the secondary electron emitted from a side wall of the pattern is changed. In the case of a pattern (for example, a line pattern) formed on a semiconductor device having a width of 10 nm or less, the expansion of the secondary electron generated due to the beam incidence may be larger than the width of the pattern. In other words, an edge position detected from the SEM image may not correspond to a simple geometric cross-sectional shape.

Under the above-described condition, it is difficult to accurately specify both the edges of the top and bottom parts of the pattern, and thus it is difficult to perform accurate height measurement. Hereinafter, a device that measures a height of a pattern with high accuracy by using a signal obtained based upon beam radiation on a sample, and a computer program or a non-transitory computer readable medium that stores the computer program will be described.

Solution to Problem

Even in the case of a fine object, in order to accurately measure a height, hereinafter, the present invention proposes a pattern height measurement method in which a plurality of signal profiles obtained by irradiating a sample region including a pattern with a beam at a plurality of incidence angles are acquired, a dimension between one end and the other end of an edge of the pattern at each incidence angle is measured from the plurality of signal profiles, a difference between the measurement results is obtained, and the difference information is inputted into an arithmetic formula indicating a relationship between the difference information and a height of the pattern, thereby obtaining the height of the pattern, a height measurement device, and a non-transitory computer readable medium that stores a program for executing height measurement.

Advantageous Effects of Invention

According to the above-described configuration, it is possible to perform accurate height measurement.

BRIEF DESCRIPTION OF DRAWINGS

FIG. 1 is a diagram illustrating an outline of a scanning electron microscope.

FIGS. 2A and 2B are diagrams illustrating an example of a pattern height measurement method using a signal profile.

FIG. 4 is a flowchart illustrating a pattern height measurement process.

FIG. 5 is a diagram illustrating an example of a graphical user interface (GUI) for setting a condition for performing the height measurement.

FIG. 6 is a flowchart illustrating the pattern height measurement process.

FIG. 7 is a diagram illustrating an example in which a plurality of signal profiles obtained by beam scanning at a plurality of different incidence angles overlap each other.

FIG. 8 is a diagram illustrating a relationship between a beam incidence angle and a profile width.

DESCRIPTION OF EMBODIMENTS

Figure 3A:
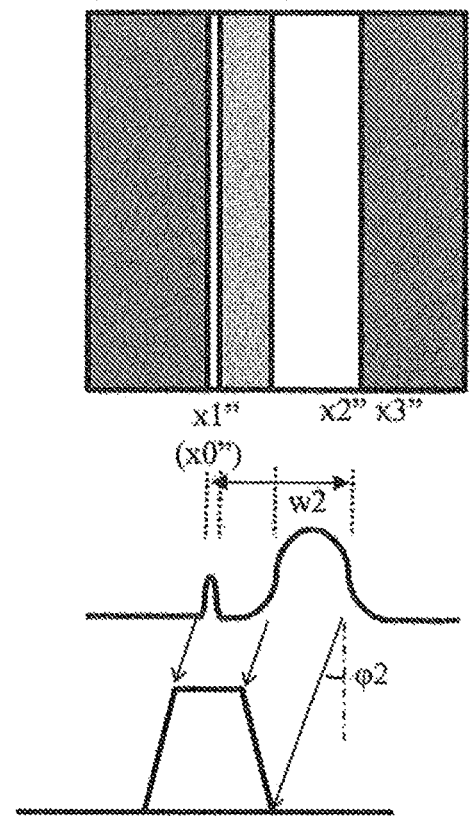
FIGS. 3A to 3C are diagrams illustrating an example in which height measurement of a pattern is performed by using a signal profile obtained by beam emission at a plurality of different incidence angles.

In order to improve the performance of a semiconductor device, in a manufacturing process thereof, in addition to miniaturization of a two-dimensional pattern width, a case of forming a three-dimensional structure pattern increases. Particularly, in the latest logic device, an electric field transistor having a structure referred to as a FinFET in which a gate is disposed to surround a fin serving as a source-drain is used. An electrical characteristic of a semiconductor pattern having such a three-dimensional structure is significantly affected by variations in a pattern cross-sectional shape such as a fin height, a line width, a side wall angle, and roundness of a corner of an upper part of the pattern. Therefore, measuring these dimensions to detect process variations is an important technique for controlling the process.

In the process control of a two-dimensional pattern whose gate width determines device performance, measurement of the line width by a scanning electron microscope (SEM) observed directly above is effective. On the other hand, since a gate length of the FinFET having the three-dimensional structure becomes the sum of the line width and side wall length of the fin, a technique for measuring the height is effective for the process control.

When measuring the height of the pattern by using a charged-particle beam device such as the SEM, it is desirable to emit a beam from a tilt direction (a direction relatively tilted with respect to a direction perpendicular to a surface of a sample). As a method for acquiring an SEM image based upon the beam emission from the tilt direction, it is considered to include: (1) a method in which a charged-particle beam to be emitted is deflected to be separated from an ideal optical axis of the beam, and a direction of the charged-particle beam is tilted with respect to a pattern to be observed, thereby obtaining a tilt image; (2) a method for capturing an image by tilting a stage itself for holding and moving a semiconductor wafer; and (3) a method for mechanically tilting an optical system column of the charged-particle beam device.

On the other hand, since an mechanical operation is required when the method for tilting the stage and the column is adopted, the time required for measurement and inspection is delayed to that extent, and further, since it is necessary to install both column and sample separately so that the column does not collide with the sample due to the tilt, the working distance becomes large. Since the resolution of the device becomes higher as the working distance is lower, it is desirable to adopt a method for tilting the beam by separating the beam from the axis by using a deflector.

The signal profile and the captured SEM image obtained when the beam is tilted are different depending on a material of the sample and a cross-sectional shape of the pattern (particularly, the side wall angle and the rounding of the upper part of the pattern), a diffusion range of a secondary electron in the sample due to the difference in a SEM condition, and a distribution of the secondary electron emitted from the side wall. There is a case in which deterioration in the resolution caused by a beam tilt may become a factor causing deterioration in measurement accuracy.

In a line pattern having a width of 10 nm or less, the expansion of the secondary electron at an incidence voltage to a pattern of a generally used primary electron becomes larger than the line pattern width. Therefore, since electrons are emitted from both left and right side walls, it is difficult to detect an edge on an upper part side of the pattern including information in a height direction. Considering the above-described condition, it may be difficult to specify the three-dimensional structure based upon a specification of an edge position. Hereinafter, a height measurement method for measuring the height of the pattern with high accuracy without detecting the edge position on the upper side of the pattern, and a charged-particle beam device will be described.

In an angle range in which the beam is tilted, when the angle is small, a width (profile width) between edges detected from a secondary electron signal profile hardly changes. When the angle is large, image blurring may occur due to aberration caused by deviation from an optical axis, and it may be difficult to stably detect the edge position of the pattern.

Hereinafter, an example in which a pattern height is calculated by using an image or a signal profile mainly acquired at a plurality of beam tilt angles will be described. An example in which a highly accurate and stable height measurement is achieved by previously obtaining a beam tilt angle range from which information necessary for height calculation can be obtained will be also described.

An example in which the height calculation is performed by using the profile width of the pattern side wall without using a top side edge where a profile is not stable due to a difference in a cross-sectional shape for each pattern and an edge effect during the tilting in a line pattern whose width is 10 nanometers or less will also be described.

An example in which left and right pattern side wall angles are calculated from a plurality of tilt images, and blurring is calculated by using at least two tilt angles whose beam tilt angle is greater than the side wall angle will also be described. The calculated blurring is corrected when calculating the height. The edge is detected considering the blurring, and the height is calculated.

The tilt angle required for the height calculation when registering a procedure of an automatic operation is obtained, thereby making it possible not only to perform the height calculation only by using the non-tilt image and the required tilt image at the time of the automatic operation, but also to achieve high speed. A parameter required for the height calculation when registering the procedure of the automatic operation is calculated, thereby making it possible to calculate the height by using the parameter at the time of registration when performing the automatic operation, but also to detect a height change with respect to the pattern at the time of registration with high sensitivity.

In the embodiment described hereinafter, a charged-particle beam device including a calculation device that mainly executes height measurement of a pattern with high accuracy will be described. The charged-particle beam device described hereinafter is controlled by a control device including, for example, a computer processor and a non-transitory computer readable medium. When a program stored on the non-transitory computer readable medium is executed by the computer processor, the program is encoded with a computer instruction for causing a system controller to execute predetermined processing, and executes control and measurement processing of the charged-particle beam device according to a processing process which will be described later.

As described above, the information necessary for the height calculation is registered in advance by using a plurality of beam tilts, thereby making it possible to perform the height measurement of the stable pattern with high accuracy.

FIG. 1 is a block diagram illustrating a configuration outline of a scanning electron microscope. An overall control device 140 controls an entire device such as an electron optical system and a wafer conveyance based upon an acceleration voltage of an electron, information on a wafer 118, and observation position information inputted by a user via a computer 144 (processor) from a user interface 143. The wafer 118 is fixed on a stage 119 existing in a sample chamber 113 after passing through a sample exchange chamber via a sample conveyance device which is not illustrated.

The electron optical system is controlled by a high voltage control device 125, a first condenser lens control part 130, a two-stage deflector control part 131, a second condenser lens control part 132, a signal amplifier 134, an alignment control part 135, a deflection signal control part 137, and an objective lens control part 138 according to an instruction from the overall control device 140.

A primary electron beam 103 (electron beam) extracted from an electron source 101 by an extraction electrode 102 is converged by a first condenser lens 106, and a current amount is limited by a condenser movable diaphragm 107. When performing the beam tilt, the beam is tilted by a two-stage deflector 108 forming a scanning part together with a scanning coil 115. Here, the two-stage deflector 108 is located below the first condenser lens 106 but is not limited thereto. The two-stage deflector 108 may be installed in the vicinity of the first condenser lens 106 or in the vicinity of a second condenser lens 109, or may be superimposed on the scanning coil 115 of the scanning part. If there is an invariable crossover position in the electron optical system, one-stage deflection may be used at that position. The tilt beam passes through the second condenser lens 109, and then is incident on an objective lens 117 at a position deviating from an optical axis 100.

When a cross position 112 on the optical axis 100 is interlocked with the first condenser lens 106, the second condenser lens 109, and the two-stage deflector 108 so that the cross position 112 does not deviate in the case of no beam tilt and in the case of the beam tilt, the SEM image scanned with the tilt beam can be acquired in the same field of view by the convergence action of the objective lens 117. An angle and an azimuth of the tilt can be adjusted by the two-stage deflector 108. Accordingly, the tilt image of any tilt angle and azimuth can be acquired. An absolute amount of the tilt angle is measured in advance by using a standard sample 120 (for example, a concave pyramid type) having a known shape disposed on the stage 119.

A retarding voltage is applied to the stage 119 by the retarding power supply 139, and a tilt incidence beam is decelerated and incident on the wafer 118. The tilt incidence beam is scanned on the wafer 118 by the scanning coil 115.

A secondary electron and a reflected electron 104 emitted from the wafer 118 are captured by a detector 133, amplified by the signal amplifier 134, and stored in a memory 145 via the overall control device 140, after which the secondary electron and the reflected electron 104 are displayed on a monitor 142 via the computer 144 as digital image data. The memory 145 has a function of superimposing (synthesizing) and storing image data for improving an S/N ratio. It is also possible to generate the signal profile from the digital image data.

A range to be measured from the digital image or the signal profile is manually or automatically selected based upon an algorithm, after which the number of pixels in the selected range is calculated. An actual dimension on the sample is measured from an actual dimension of an observation region scanned by the primary electron beam 103 and the number of pixels corresponding to the observation region.

In the above description, the scanning electron microscope using the electron beam is described as an example of the charged-particle beam device, but the present invention is not limited thereto. For example, an ion beam emission device using an ion beam may be used.

Next, a height calculation method will be described with reference to FIGS. 2 and 3 by a line pattern often measured in a semiconductor pattern as an example. A height measurement application can be stored in a memory incorporated in the overall control device 140 or the memory 145. The stored application may be loaded from an external storage medium into the memory 145, and may be executed by the overall control device 140. The application can be configured to control the scanning electron microscope to perform beam emission from a plurality of angles which will be described later. The application also can generate the signal profile based upon the electron detected by the detector 133 based upon the beam emission on the sample, and can include a dimension value measurement module that obtains a pattern dimension value for each beam emission angle based upon the signal profile, and a height measurement module that measures a pattern height based upon a dimension measurement result.

FIG. 2 illustrates a cross-sectional view of a line pattern, a signal profile obtained when scanning, and a schematic view of an SEM image. In the embodiment, an example of measuring a trapezoidal pattern in which the height of the cross-sectional shape is h and the left and right side wall angles (relative angles with respect to a perpendicular line of a wafer surface) are respectively $\theta L$ and $\theta R$ will be described. In a case where the beam tilt angle is 0 degree as illustrated in FIG. 2A and the edge position can be accurately specified, when the side wall angle of the pattern is known, it is possible to calculate the height from edge positions x0, x1, x2, and x3 determined according to any measurement algorithm from the signal profile.

However, it is difficult to measure the side wall angle of the pattern by observation from directly above, and thus it is required to measure the side wall angle thereof by another device such as a cross-sectional SEM or AFM. Here, as illustrated in FIG. 2B, the beam is tilted at an angle $\varphi 1$ to acquire the SEM image, and height information is obtained from a change in the edge position. When the edge positions x1' and x2' reflecting the height information on the upper part side of the line pattern are used, a pattern height H can be calculated by, for example, [Equation 1].

$$H=\{(x1+x2)-(x1'+x2')\}/(2\times\tan\varphi 1) \qquad \text{[Equation 1]}$$

On the other hand, x0, x1, x0', and x1' indicate the edge positions on the upper part side of the line pattern, and as described above, when the expansion of the secondary electron generated by the incidence of the electron beam on the pattern becomes larger than that of a line width of the pattern due to the miniaturization of the pattern, it may be difficult to accurately specify the edge position of the upper part side. On the other hand, edge points x0' and x3' on the SEM image corresponding to a line pattern bottom edge have a clear boundary between a region where a large amount of secondary electrons is generated by the edge effect and a region other than the aforementioned region, whereby the position can be specified accurately. A distance between x0' and x3' does not substantially change regardless of the change in the beam tilt. In the case of "beam tilt angle side wall angle", since a width of an edge on the side where a wall surface is hidden by the beam tilt (side wall which becomes the back side of a pattern upper surface when viewed from the electron source) becomes apparently minimized such that the position of the edge can be easily specified, the profile width can be measured with high accuracy. Hereinafter, a pattern height measurement method using the profile width will be described.

FIG. 3A is a diagram illustrating an example of a signal profile obtained when a beam tilt angle (relative angle with respect to the perpendicular line to the wafer surface) $\varphi 2$ is set to be equal to or greater than the side wall angle $\theta L$ of the left side pattern. When the beam tilt angle $\varphi 2$ is equal to or greater than the pattern side wall angle $\theta R$, the primary electron beam does not reach a sample surface portion (bottom part) adjacent to a left side edge and hidden in the left edge. Accordingly, a left side edge position x1" (x0") can be defined as a pattern measurement start point (or measurement end point) of the signal obtained by scanning the pattern.

Figure 3B:
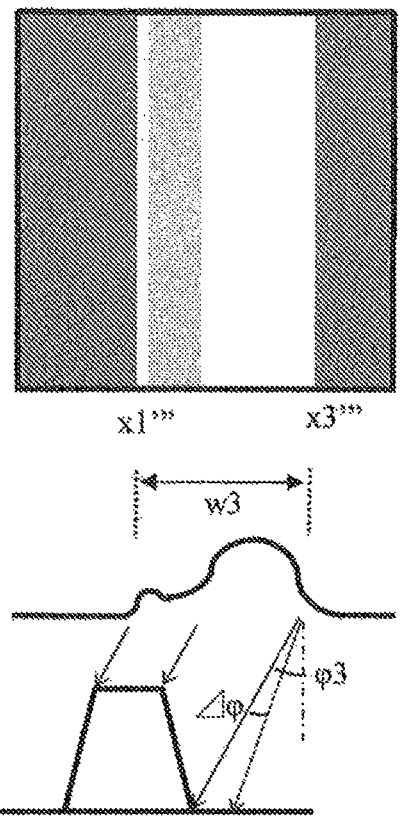
Figure 3C:
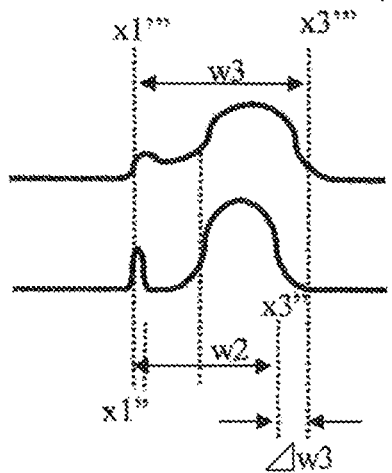

When an beam tilt angle $\varphi 3$ is set to be greater than $\varphi 2$ as illustrated in FIG. 3B, it is possible to calculate a height (H3) of the pattern with [Equation 2] by using a change amount $\Delta \varphi$ (=$\varphi 3-\varphi 2$) and a change amount $\Delta w3=w3-w2$ of the profile width on the SEM image in FIG. 3C.

$$H3=\Delta w3/\tan(\Delta\varphi) \qquad \text{[Equation 2]}$$

When performing the height measurement as described above, the control device executes processing as illustrated in FIG. 6. First, the stage 119 and the deflector for moving the field of view are controlled to position the field of view of the scanning electron microscope on the pattern to be measured for the height thereof (step 601). Next, after setting a deflection condition of the two-stage deflector 108 to become a predetermined beam emission angle (step 602), the beam is scanned, after which the signal profile is generated based upon the electron detected based upon the beam scanning (steps 603 and 604). The signal profile is generated for each of the plurality of emission angles.

Next, a measurement reference point is extracted (step 605). In the case of an example of FIG. 3, measurement reference points (x1", x1''') at one end side of the pattern and measurement reference points (x3", x3''') at the other end side thereof are extracted. In order to obtain the measurement reference point from the signal profile, for example, the signal profile may be differentiated, and a position of the signal profile of a position corresponding to a peak point may be defined as the edge position. Next, the dimensions w2 and w3 between the measurement reference points are measured, and a difference therebetween ΔW3 is calculated (steps 606 and 607).

ΔW3 obtained as described above and Δφ obtained by calculating a difference (φ3−φ2) from and the beam tilt angles φ2 and φ3 set in advance as a device condition are inputted into [Equation 2], thereby calculating the pattern height (H3) (steps 608 and 609).

While the edge on one end side (left side) uses information obtained from the top part of the pattern, since φ2 and φ3 are set to angles greater than the side wall angle and the apparent edge width is minimized, the exact edge position can be specified, and since the edge on the other end side (right side) uses information on the bottom side of the pattern, in the same manner, the edge position can be accurately specified in the same manner. By setting both φ2 and φ3 to be equal to or greater than the side wall angle, it is possible to stabilize the measurement reference of the profile width (left side edge position), and as a result, the height measurement can be performed with high accuracy.

Next, an example, in which the left and right pattern side wall angle θL or θR and a coefficient k for arbitrarily determining the pattern height position corresponding to the edge position on the detected SEM image are introduced, thereby measuring the height of the pattern by using an assumed model, will be described. In the example, a pattern height Hi is calculated by using a beam tilt angle φi, Equation 3, and Equation 4, or both. Equation 3 indicates a case where the beam is emitted from the left side with the beam tilt angle direction (case where the beam is emitted from a direction in which the edge on the right side is hidden at the upper part of the pattern when viewed from the emission direction of the electron beam), and Equation 4 indicates a case of an arithmetic formula applied to the height measurement when the beam is emitted from the right side.

$$Hi=(Wi-Wo)/(\tan \varphi i - k \times \tan \theta L)$$ [Equation 3]

$$Hi=(Wi-Wo)/(\tan \varphi i - k \times \tan \theta R)$$ [Equation 4]

φi: beam tilt angle
Hi: height of a pattern obtained based upon a signal obtained by beam scanning at a tilt angle θi
Wi: width of a signal profile obtained by the beam scanning at the tilt angle θi
Wo: width of a signal profile obtained by beam scanning at a beam tilt angle of 0 degree
k: coefficient for determining a height
θL: tilt angle of the left side wall
θR: tilt angle of the right side wall The angles θL and θR of the left and right pattern side walls and the coefficient k for determining the height position vary depending on various factors such as a pattern cross-sectional shape, a material, and a SEM condition. Here, a method for performing optimization from a plurality of SEM images having different beam tilt angles or a signal profile p(i) will be described with reference to FIGS. 4 and 5.

In the example, first, a plurality of Wi corresponding to angles are obtained by using beams having a plurality of tilt angles. When the beam tilt angle is equal to or greater than a side wall tilt angle, on the assumption that the height Hi calculated by Equation 3 or 4 does not change even though the beam tilt angle is changed, constrained optimization processing for obtaining θL, θR, and k is executed on the constrained condition that the height Hi is not changed (or does not deviate from a predetermined range). k is a coefficient for correcting a variation factor associated with blurring caused by an aberration generated by the beam tilt. In the optimization processing, for example, a steepest descent method, a simplex, or a genetic algorithm and a neural network can be applied.

The algorithm for determining the edge position from the signal profile can use, for example, a threshold method that defines an intersection of a threshold value internally divided at a predetermined ratio with respect to the maximum value and the minimum value of brightness values of the left and right edges and a profile as the edge position; and a differentiation method in which the signal profile is differentiated, and a signal profile position corresponding to a peak position of a differentiated waveform is set as the edge position so that the maximum tilt position of the left and right edges is set as the edge position.

With respect to the edge on the side where the side wall whose edge position is clear is hidden at the upper part of the pattern, a peak position is identified as described above, and a signal amount at the peak position is set as a threshold value, and further the edge position of the other edge is specified by the threshold method by using the threshold value, whereby edge position detection can be performed under the same condition regardless of a change in the angle.

FIG. 7 is a diagram illustrating an example in which differential processing is performed on a signal profile corresponding to the edge on the side hidden at the upper part of the pattern (edge on the left side in the example) by the beam tilt, and a plurality of signal profiles obtained by the beam emission at different tilt angles overlap each other so that positions of profile waveforms corresponding to a peak position of a differentiated waveform coincide with each other. Here, an example in which six signal profiles obtained when the tilt angle is changed every 2° from 0° to 10° overlap with each other will be described. FIG. 7 illustrates an example in which the positions corresponding to the peak positions of the differential waveforms of the respective signal profiles overlap with each other at a point S. An example, in which the point S is set as the measurement reference point, its brightness value is set as a threshold value (Th), and the measurement reference point of an edge of the right side (opposite side) is set.

When the beam incidence angle increases, the beam deviates from the ideal optical axis, and blurring caused by aberration occurs, but the measurement reference point can be specified with high accuracy by using the differential waveform even though the blurring occurs. The blurring can be suppressed by generating the aberration that cancels aberration associated with the beam tilt by a Wien filter and an aberration correction lens.

Dimensions ($W_{0d}$ to $W_{10d}$) between an edge of one end of the pattern and an edge of the other end thereof are measured by using the signal profile generated as described above. FIG. 8 is a diagram illustrating a relationship between the beam tilt angle and the dimension value (profile width) of the pattern obtained by beam scanning at each beam tilt angle. FIG. 8 illustrates an example in which the profile width obtained when the beam is tilted from $-W_{nd}$ to $+W_{nd}$ is plotted. As illustrated in FIG. 8, in the case of "beam incidence angle<pattern side wall tilt angle", the profile width does not substantially change, and in the case of "beam incidence angle≥pattern side wall tilt angle", the profile width changes according to tamp. In the embodiment, there is the tilt beam having the incidence angle or more in which the edge portion of the upper surface of the pattern and the position of the lower surface thereof appear to coincide with each other (beam incidence angle=side wall tilt angle), and height estimation of the pattern is performed by using at least two signal profiles (at least two signal profiles obtained by the beam scanning at different incidence angles).

When obtaining the pattern side wall angle, the beam incidence angle at which the profile width starts to change can be defined as the side wall angle by using a phenomenon in which as illustrated in FIG. 8, in the case of "beam incidence angle<side wall tilt angle", the profile width does not change, and in the case of "beam incidence angle≥side wall tilt angle", the profile width changes in response to the incidence angle of the beam (as the incidence angle becomes greater, the profile width also becomes greater). The beam incidence angle is stored in advance in association with a beam deflection signal, and the beam incidence angle when a change in the profile width starts is outputted as the side wall angle. When the set incidence angle is not equal to the side wall angle, for example, as illustrated in FIG. 8, abeam incidence angle corresponding to an intersection 803 of an approximate straight line 801 that approximates data of a plurality of profile widths obtained by the beam scanning at a small incidence angle, and an approximate straight line 802 connecting data of a plurality of profile widths obtained by the beam scanning at a relatively large incidence angle may be outputted as the side wall angle.

When measuring the height of the pattern, first, a user inputs an expected height He into a height input window 401 of a height measurement condition setting screen 400 as illustrated in FIG. 4 displayed on the monitor 142, after which a setting button 402 is pressed. A height measurement application calculates a SEM condition and a tilt angle parameter recommended by the computer 144 by using a value of the expected height He.

A magnification displayed on a magnification display part 411 can be calculated by using a scan size inputted in a scan size setting window 412 and the inputted expected height He. For example, when the expected height is 100 nm, a width change amount Δw for changing the profile width by 5% becomes 5 nm, and the magnification (scan region 512×2.5=1280 nm) is calculated so that half 2.5 nm of this value becomes one pixel, after which the calculated magnification is displayed on the magnification display part 411. The number of frames to be inputted to a number-of-frames setting window 413 (integrated number of frames required to form one image) is inputted while looking at the S/N of the actual pattern. As the expected height He, design data may be inputted.

A division tilt angle display part 421 of the tilt parameter performs calculation by substituting the expected height He and Δw into [Equation 5]. A minimum tilt angle and a maximum tilt angle displayed in a minimum and maximum tilt angle setting window 422, and the number of repetitions n displayed in a number-of-repetitions setting window 423 are calculated based upon Δφ.

$$\Delta\varphi = \tan^{-1}(\Delta w/He)$$

While the above-described setting value shows an example of automatic calculation, the setting value can be executed by using any value inputted by the user. All the length measurement parameters may be inputted by the user. In a length measurement type setting window 431, it is possible to select a type of a pattern to be measured such as Line/Space. In a length measurement method setting window 432, it is possible to specify the above-described threshold method and differentiation method, and other methods. A smoothing filter size setting window 433 is set to improve the S/N with respect to the signal profile. In a region size setting window 434, a region on the image of the pattern for executing the height calculation is specified.

After setting the parameter as described above, when an execution button 450 is pressed, the height calculation is executed. FIG. 5 is a flowchart illustrating a measurement processing process. When the process is executed, the SEM condition and the tilt parameter set on the height measurement condition setting screen 400 are read by the computer 144 (S1). Next, the SEM condition and the value of the tilt parameter are sent to the overall control device 140. The overall control device 140 issues an instruction for setting a control value to each control part. Each control part sets a control value for a control object (S2). For example, the setting of magnification is set to a scan width corresponding to the magnification by controlling the scanning coil 115 by the deflection signal control part 137. First, an image at the beam tilt angle of 0 degree is acquired, and a profile width w0 is measured according to the length measurement parameter set on the height measurement condition setting screen 400 (S3). Next, the image is acquired while changing the beam tilt angle by Δφ, and a profile width wi is measured at each beam tilt angle (S4). This operation is repeatedly executed in response to a condition set in the number-of-repetitions setting window 423 and the minimum and maximum tilt angle setting window 422 (S7).

An absolute value of a difference between the profile widths w0 and wi when the beam tilt angle is 0 degree is calculated in order to determine the beam tilt angle equal to or greater than the side wall tilt angle at this time, and this process is repeated until the value becomes greater than a predetermined value (S5). When the signal profile obtained by the beam scanning at the beam tilt angle equal to or greater than the side wall tilt angle is obtained by an amount required for obtaining the unknowns k, θL, and θR as described above, the repetition processing is terminated (S6). That is, when the profile width obtained by the beam scanning at the tilt angle suitable for the height measurement reaches the number required for the calculation using [Equation 3] and [Equation 4], the repetition processing is terminated.

Next, k, θL, and θR are obtained such that the residual of Hi obtained by using [Equation 3] and [Equation 4] between different beam tilt angles becomes minimum by using the information on the obtained plurality of profile widths, and based upon these values, the pattern height and the left and right side wall angles of the pattern are calculated (S8). The calculated result is displayed in a height measurement result display column 440, and a side wall angle display column 441, (S9), and the processing is terminated.

The above-described processing is executed when registering the automatic operation procedure, and at the time of executing the automatic operation, the height Hi can be calculated by using the profile width w0 and the profile width wi at the beam tilt angle equal to or greater than the side wall tilt angle by using k, θL, and θR obtained at the time of registration. These values can be used arbitrarily depending on the stability of a semiconductor manufacturing process.

REFERENCE SIGNS LIST

100: optical axis
101: electron source
102: extraction electrode
103: primary electron beam
104: secondary electron and reflected electron
106: first condenser lens
107: condenser movable diaphragm
108: two-stage deflector
109: second condenser lens
112: cross position
113: sample chamber
115: scanning coil
117: objective lens
118: wafer
119: stage
120: standard sample
125: high voltage control device
130: first condenser lens control part
131: two-stage deflector control part
132: second condenser lens control part
133: detector
134: signal amplifier
135: alignment control part
137: deflection signal control part
138: objective lens control part
139: retarding power supply
140: overall control device
142: monitor
143: user interface
144: computer
145: memory
400: height measurement condition setting screen
401: height input window
402: setting button
411: magnification display part
412: scan size setting window
413: number-of-frames setting window
421: division tilt angle display part
422: minimum and maximum tilt angle setting window
423: number-of-repetitions setting window
431: length measurement type setting window
432: length measurement method setting window
433: smoothing filter size setting window
434: region size setting window
450: execution button

The invention claimed is:

1. A pattern measurement tool, comprising:
a charged-particle beam sub-system including a tilt deflector that tilts a beam emitted from a charged particle source and irradiates a pattern with the beam; and
a computer sub-system which is connected to the charged-particle beam sub-system and which is for executing measurement or the pattern based upon a signal obtained by the charged-particle beam sub-system, wherein
the computer sub-system causes the charged-particle beam sub-system to acquire at least two signal profiles by
scanning a pattern with beams emitted from the charged-particle source having at least two incidence angles that are different from each other,
measures two of dimensions or widths between one end and the other end of the pattern based upon the at least two signal profiles,
calculates a difference between the two of the dimensions or the widths, and
calculates a height of the pattern by inputting a difference value determined by the calculation into a relational formula indicating a relationship between the height of the pattern and the difference value,
the at least two or more incidence angles include at least, two or more incidence angles of a side wall angle of the pattern or greater, and
the computer sub-system calculates $\Delta\varphi(=\varphi 3-\varphi 2)$ from angles $\varphi 2$ and $\varphi 3(\varphi 3>\varphi 2)$ of the two incidence angles, and calculates a pattern height H3 by using the following equation:

$$H3 = \Delta w3 / \tan(\Delta\varphi)$$

wherein
$\Delta w3$: a difference value between a measurement value w2 between one end and the other end of a pattern obtained from a signal profile obtained by scanning of a beam incident at the incidence angle $\varphi 2$ equal to or greater than the side wall angle of the pattern, and a measurement value w3 between one end and the other end of a pattern obtained from a signal profile obtained by scanning of a beam incident at the incidence angle $\varphi 3$ equal to or greater than the side wall angle of the pattern.

2. A pattern measurement tool, comprising:
a charged-particle beam sub-system including a tilt deflector that tilts a beam emitted from a charged-particle source and irradiates a pattern with the beam; and
a computer sub-system which is connected to the charged-particle beam sub-system and which is for executing measurement of the pattern based upon a signal obtained by the charged-particle beam sub-system, wherein
the computer sub-system causes the charged-particle beam sub-system to acquire at least two signal profiles by
scanning a pattern with beams emitted from the charged-particle source having at least two incidence angles that are different from each other,
measures two of dimensions or widths between one end and the other end of the pattern based upon the at least two signal profiles, calculates a difference between the two of the dimensions or the widths, and calculates a height of the pattern by inputting a difference value determined by the calculation into a relational formula indicating a relationship between the height of the pattern and the difference value, the at least two or more incidence angles include at least two or more incidence angles of a side wall angle of the pattern or greater, the computer sub-system inputs the difference value and the incidence angle of the beam into a relational formula indicating a relationship between the height of the pattern, the difference value, the incidence angle of the beam, and the side wall angle of the pattern, and executes constrained optimization processing on the constrained condition that the height of the pattern does not change or does not deviate from a predetermined range.

3. The pattern measurement tool according to claim 2, wherein the computer sub-system calculates the side wall angle of the pattern based upon the constrained optimization processing.

4. The pattern measurement tool according to claim 2, wherein the computer sub-system calculates the height of the pattern by using the following relational formula:

$$Hi=(Wi-Wo)/(\tan \varphi i - k \times \tan \varphi)$$

wherein
- $\varphi i$: a beam tilt angle
- $Hi$: a height of a pattern obtained based upon a signal obtained by beam scanning at a tilt angle $\varphi i$
- $Wi$: a width of a signal profile obtained by the beam scanning at the tilt angle $\varphi i$
- $Wo$: a width of a signal profile obtained by beam scanning at a beam tilt angle of 0 degree
- $k$: a coefficient for determining the height
- $\varphi$: a tilt angle of the side wall.

5. A non-transitory computer-readable medium comprising program instructions operable, when executed by a computer system of a pattern measurement tool, to cause the computer system to execute measurement of a pattern formed on a sample, comprising:

acquiring, from the pattern measurement tool, at least two signal profiles obtained when beam scanning of the pattern is performed with beams emitted from a charged particle source having at least two or more incidence angles that are different from each other, including a signal prolate obtained when the beam scanning is performed at an incidence angle equal to or greater than a side wall angle of the pattern;

measuring two of dimensions or widths between one end and the other end of the pattern based upon the at least two signal profiles;

calculating a difference between the two of the dimensions or the widths, and calculating a height of the pattern by inputting a difference value determined by the calculation into a relational formula indicating a relationship between the height of the pattern and the difference value, wherein the at least two or more incidence angles include at least two or more incidence angles of the side wall angle of the pattern or greater, and $\Delta\varphi(=\varphi 3-\varphi 2)$ is calculated from angles $\varphi 2$ and $\varphi 3$ ($\varphi 3 > \varphi 2$) of the two incidence angles, and a pattern height H3 is calculated by using the following equation:

$$H3=\Delta w3/\tan(\Delta\varphi)$$

wherein
- $\Delta w3$: a difference value between a measurement value w2 between one end and the other end of a pattern obtained from a signal profile obtained by scanning of a beam incident at the incidence angle $\varphi 2$ equal to or greater than the side wall angle of the pattern, and a measurement value w3 between one end and the other end of a pattern obtained from a signal profile obtained by scanning of a beam incident at the incidence angle $\varphi 3$ equal to or greater than the side wall angle of the pattern.

6. A non-transitory computer-readable medium comprising program instructions operable when executed by a computer system of a pattern measurement tool to cause the computer system to execute measurement of a pattern formed on a sample, comprising:

acquiring, from the pattern measurement tool, at least two signal profiles obtained when beam scanning of the pattern is performed with beams emitted from a charged particle source having at least two or more incidence angles that are different from each other, including a signal prolate obtained when the beam scanning is performed at an incidence angle equal to or greater than a side wall angle of the pattern;

measuring two of dimensions or widths between one end and the other end of the pattern based upon the at least two signal profiles;

calculating a difference between the two of the dimensions or the widths, and calculating a height of the pattern by inputting a difference value determined by the calculation into a relational formula indicating a relationship between the height of the pattern and the difference value, wherein the at least two or more incidence angles include at least two or more incidence angles of the side wall angle of the pattern or greater;

the difference value and the incidence angle of the beam are inputted into a relational formula indicating a relationship between the height of the pattern, the difference value, the incidence angle of the beam, and the side wall angle of the pattern, and constrained optimization processing is executed on the constrained condition that the height of the pattern does not change or does not deviate from a predetermined range.

7. The computer readable medium according to claim 6, wherein the side wall angle of the pattern is calculated based upon the constrained optimization processing.

8. The computer readable medium according to claim 6, wherein the height of the pattern is calculated by using the following relational formula:

$$Hi=(Wi-Wo)/(\tan \varphi i - k \times \tan \theta)$$

wherein
- $\varphi i$: a beam tilt angle
- $Hi$: a height of a pattern obtained based upon a signal obtained by beam scanning at a tilt angle $\theta i$
- $Wi$: a width of a signal profile obtained by the beam scanning at the tilt angle $\theta i$ Wo: a width of a signal profile obtained by beam scanning at a beam tilt angle of 0 degree
k: a coefficient for determining the height
θ: a tilt angle of the side wall.

* * * * *